(12) United States Patent
Notzel

(10) Patent No.: US 12,087,868 B2
(45) Date of Patent: Sep. 10, 2024

(54) EPITAXIAL WAFER, METHOD OF MANUFACTURING THE EPITAXIAL WAFER, DIODE, AND CURRENT RECTIFIER

(71) Applicant: SOUTH CHINA NORMAL UNIVERSITY, Guangdong (CN)

(72) Inventor: Richard Notzel, Guangzhou (CN)

(73) Assignee: SOUTH CHINA NORMAL UNIVERSITY, Guangdong (CN)

( * ) Notice: Subject to any disclaimer, the term of this patent is extended or adjusted under 35 U.S.C. 154(b) by 300 days.

(21) Appl. No.: 17/629,343

(22) PCT Filed: Sep. 11, 2019

(86) PCT No.: PCT/CN2019/105398
§ 371 (c)(1),
(2) Date: Jan. 21, 2022

(87) PCT Pub. No.: WO2021/042407
PCT Pub. Date: Mar. 11, 2021

(65) Prior Publication Data
US 2022/0254939 A1    Aug. 11, 2022

(30) Foreign Application Priority Data
Sep. 2, 2019 (CN) .......................... 201910849997.0

(51) Int. Cl.
*H01L 29/885* (2006.01)
*H01L 21/02* (2006.01)
(Continued)

(52) U.S. Cl.
CPC ...... *H01L 29/885* (2013.01); *H01L 21/02381* (2013.01); *H01L 21/02433* (2013.01);
(Continued)

(58) Field of Classification Search
None
See application file for complete search history.

(56) References Cited

U.S. PATENT DOCUMENTS 6,255,150 B1   7/2001   Wilk et al.
10,347,790 B2   7/2019   Ma et al.
(Continued)

FOREIGN PATENT DOCUMENTS

CN   1109639 A   10/1995
CN   1799123 A    7/2006
(Continued)

OTHER PUBLICATIONS

International Search Report and Written Opinion mailed May 20, 2020, for International Patent Application No. PCT/ CN2019/ 105398, filed Sep. 11, 2019.
(Continued)

*Primary Examiner* — Khaja Ahmad
(74) *Attorney, Agent, or Firm* — Davis Wright Tremaine LLP

(57) ABSTRACT

An epitaxial wafer, a method of manufacturing the epitaxial wafer, a diode, and a current rectifier are provided. The epitaxial wafer comprises a Si substrate layer; an insulating layer formed on the Si substrate layer; and a nitride semiconductor layer formed on a surface of the insulating layer facing away from the Si substrate layer; wherein the insulating layer has a thickness configured such that under a forward bias voltage, the insulating layer may allow electrons and holes to pass from one side to the other side of the insulating layer via quantum tunneling so as to allow a forward current flow.

17 Claims, 3 Drawing Sheets

(51) Int. Cl.
*H01L 29/20* (2006.01)
*H01L 29/66* (2006.01)
*H02M 7/06* (2006.01)

(52) U.S. Cl.
CPC .... *H01L 21/02488* (2013.01); *H01L 21/0254* (2013.01); *H01L 21/02631* (2013.01); *H01L 29/2003* (2013.01); *H01L 29/66204* (2013.01); *H02M 7/06* (2013.01)

(56) References Cited

U.S. PATENT DOCUMENTS

| | | |
|---|---|---|
| 2002/0070428 A1 | 6/2002 | Bernhoff et al. |
| 2009/0173373 A1* | 7/2009 | Walukiewicz ........ H01L 31/072 136/244 |
| 2010/0095998 A1* | 4/2010 | Walukiewicz ...... H01L 31/0687 257/E31.022 |
| 2013/0187215 A1* | 7/2013 | Sandhu .................. H10B 41/30 977/762 |
| 2018/0277715 A1* | 9/2018 | Ma .......................... H01L 33/32 |
| 2019/0109319 A1* | 4/2019 | Noetzel .................. H01G 9/205 |
| 2020/0235085 A1* | 7/2020 | Tao ........................ H01L 25/18 |

FOREIGN PATENT DOCUMENTS

| | | |
|---|---|---|
| CN | 1842917 A | 10/2006 |
| CN | 102576726 A | 7/2012 |
| CN | 103579500 A | 2/2014 |
| CN | 104992902 A | 10/2015 |
| CN | 108649031 A | 10/2018 |
| EP | 0657936 A1 | 6/1995 |
| KR | 101419173 B1 | 7/2014 |
| WO | 2005117143 A1 | 8/2005 |

OTHER PUBLICATIONS

First Office Action for Chinese Patent Application No. 201910849997.0 dated Sep. 4, 2020, 22 pages.
Second Office Action for Chinese Patent Application No. 201910849997.0 dated Feb. 19, 2021, 16 pages.
Notification to Grant Patent Rights Invention for Chinese Patent Application No. 201910849997.0, 3 pages.
First Search Report for Chinese Patent Application No. 201910849997.0, 2 pages.
Supplementary Search Report for Chinese Patent Application No. 201910849997.0, 1 page.
Gomez, V.J. et al., "Comparative Study of Single InGaN Layers Grown on Si(111) and Gan(0001) Templates: The Role of Surface Wetting and Epitaxial Constraint" Journal of Crystal Growth, vol. 447, Aug. 1, 2016, 5 pages.
European Patent Office, "Search Report" in Application No. 19944002. 5-1212, Jul. 6, 2022, 2 pages.
Aseev, Pavel, et al., Near-infrared Emitting In-rich InGaN Layers Grown Directly on Si: Towards the Whole Composition Range, Applied Physics Letters, 106, Published Online Feb. 17, 2015, 5 pages.
European Patent Office, "Communication Pursuant to Article 94(3) EPC", in Application No. 19944002.5-1212, Jul. 18, 2022, 5 pages.

* cited by examiner

EPITAXIAL WAFER, METHOD OF MANUFACTURING THE EPITAXIAL WAFER, DIODE, AND CURRENT RECTIFIER

CROSS-REFERENCE TO RELATED APPLICATIONS

This application is a 371 U.S. National Phase of International Patent Application No. PCT/CN2019/105398, filed Sep. 11, 2019, entitled "EPITAXIAL WAFER, METHOD OF MANUFACTURING THE EPITAXIAL WAFER, DIODE, AND CURRENT RECTIFIER," which claims priority to Chinese Patent Application No. 201910849997.0, filed Sep. 2, 2019, entitled "EPITAXIAL WAFER, METHOD OF MANUFACTURING THE EPITAXIAL WAFER, DIODE, AND CURRENT RECTIFIER," the contents of which are incorporated herein by reference in their entirety.

TECHNICAL FIELD

The present disclosure relates to the technical field of semiconductor components, and in particular to an epitaxial wafer, a method of manufacturing the epitaxial wafer, a diode, and a current rectifier.

BACKGROUND ART

A diode is a semiconductor electronic component which allows current to flow under a forward bias voltage, while blocks the current under a reverse bias voltage. In general, the diode may be an electron tube, a solid-state device, or a mechanical device. The most important application of diodes is their use in current rectifiers for the conversion of an alternating current into a direct current needed for computers, mobile phones, televisions, or other electrical appliances daily used.

In modern electronic products, solid-state current rectifying components are ubiquitous. The solid-state current rectifying components may be either P-N junction diodes or metal-semiconductor junction diodes (i.e., Schottky diodes). In various designs, P-N junction diodes are most commonly used.

For P-N junction diodes, an N-type semiconductor (doped with donor-type impurities) and a P-type semiconductor (doped with acceptor-type impurities) are brought into contact. In the N-type semiconductor, free electrons are the majority carriers and holes are the minority carriers. In the P-type semiconductor, holes are the majority carriers and free electrons are the minority carriers. Therefore, the P-N junction diodes are classed as bipolar components. Upon the N-type semiconductor is brought into contact with the P-type semiconductor, free electrons move from the N-type semiconductor into the P-type semiconductor. Correspondingly, holes can be considered as moving from the P-type semiconductor into the N-type semiconductor. This results in an electric potential opposing the flow of the carriers, until the flow stops in equilibrium. This process establishes the built-in voltage (potential) over a depletion region for carriers. Under a forward external bias voltage, a negative external electromotive force is applied to the N-type semiconductor and a positive external electromotive force is applied to the P-type semiconductor. When an electric potential difference between the negative external electromotive force and the positive external electromotive force approaches the built-in voltage, free electrons move from the N-type semiconductor into the P-type semiconductor, where they recombine with holes. Correspondingly, holes can be considered as moving from the P-type semiconductor into the N-type semiconductor, where they recombine with free electrons. This results in a large forward current, with the externally applied bias voltage increasing exponentially, and the flow direction of the current is determined by the majority carriers. The turn-on voltage depends on the band gap energy of the semiconductors used. The turn-on voltage is typically around 0.7 V for a Si P-N junction diode. Under a reverse bias voltage, only the minority carriers move from one semiconductor into the other semiconductor. As there are only few minority carriers, the reverse current is very small. Therefore, current rectifying can be realized using the characteristic of allowing a large forward current while blocking a reverse current, that is to say, the current is only allowed to flow in one direction.

Schottky diodes operate differently therefrom in that Schottky diodes are components of pure majority carriers and are formed by bonding a metal electrode to an N-type semiconductor, therefore Schottky diodes are classed as unipolar components. For Schottky diodes, under a forward bias voltage, electrons flow from the semiconductor to the metal, resulting in a step increase of current with the bias voltage. The current depends on the Schottky barrier formed at an interface between the metal and the semiconductor. The turn-on voltage is typically around 0.3 to 0.5 V, which is specifically dependent on the metals used. Under a reverse bias voltage, the current is blocked by the Schottky barrier and the Schottky barrier extends with the increasing bias voltage, thus a depletion region is formed in the semiconductor. Minority carriers are not present in Schottky diodes since there is no P-type semiconductor material.

Currently, P-N junction diodes and Schottky diodes are the only solid-state current rectifying components. The two types of diodes are both based on energy barriers established due to the formation of semiconductor/semiconductor or semiconductor/metal junctions.

SUMMARY

One of the objects of the present disclosure is to provide a diode having an operation principle different from both the P-N junction diode and the Schottky diode, an epitaxial wafer for manufacturing the diode and a method of manufacturing the epitaxial wafer, and a current rectifier using the diode.

In a first aspect, the present disclosure provides an epitaxial wafer, the epitaxial wafer comprising:
  a Si substrate layer;
  an insulating layer formed on the Si substrate layer; and
  a nitride semiconductor layer formed on a surface of the insulating layer facing away from the Si substrate layer;
  wherein the insulating layer is configured to have a thickness allowing free electrons to pass through the insulating layer via quantum tunneling.

Optionally, the insulating layer is a $SiN_x$ thin film layer.

Optionally, the insulating layer has a thickness of 1 to 4 nanometers.

Optionally, the insulating layer has a thickness of 2 to 3 nanometers.

Optionally, the nitride semiconductor layer is an InGaN layer made by mixing GaN with InN.

Optionally, the In in the InGaN layer is between 30% and 80%.

Optionally, a conduction band of the InGaN layer is aligned with a valence band of the Si substrate layer.

Optionally, the InGaN layer has a thickness between 50 nanometers and 2 microns.

Optionally, the InGaN layer is a homogeneous layer with uniform In content, or a heterostructure layer with varying In content.

Optionally, a ratio of content of InN to GaN in the InGaN layer is 46:54.

Optionally, the Si substrate layer is a P-type Si (111) wafer.

In a second aspect, the present disclosure provides a method of manufacturing an epitaxial wafer, the method comprising following steps of:

providing a Si substrate layer;

forming an insulating layer on a surface of the Si substrate layer; and forming a nitride semiconductor layer on a surface of the insulating layer facing away from the Si substrate layer;

wherein a thickness of the insulating layer is configured to allow free electrons to pass through the insulating layer via quantum tunneling.

Optionally, the insulating layer is a $SiN_x$ thin film layer; and the formation of the $SiN_x$ thin film layer includes molecular beam epitaxy.

Optionally, the insulating layer has a thickness of 1 to 4 nanometers.

Optionally, the insulating layer has a thickness of 2 to 3 nanometers.

Optionally, the nitride semiconductor layer is an InGaN layer made by mixing GaN with InN; and the formation of the InGaN layer includes molecular beam epitaxy.

Optionally, the In content in the InGaN layer is between 30% and 80%.

Optionally, the step of providing a Si substrate layer includes:

providing a P-type Si (111) wafer as the Si substrate layer.

In a third aspect, the present disclosure provides a diode, wherein the diode is made from the epitaxial wafer according to the present disclosure.

In a fourth aspect, the present disclosure provides a current rectifier, the current rectifier comprising the diode according to the present disclosure.

The solutions provided in the present disclosure at least bring about the following advantageous effects:

In the epitaxial wafer, the method of manufacturing the epitaxial wafer, the diode, and the current rectifier according to the present disclosure, the insulating layer is added between the Si substrate layer and the nitride semiconductor layer. Under a forward bias voltage, the insulating layer may allow electrons to pass from one side to the other side of the insulating layer via quantum tunneling and recombine with holes; and under a reverse bias voltage, the insulating layer can hinder formation of free electrons and holes so as to block a reverse current. Thus, the epitaxial wafer can have the characteristic of allowing passage of a current only in one direction and can be made into current rectifying components such as diodes or the like.

BRIEF DESCRIPTION OF DRAWINGS

In order to more clearly illustrate technical solutions of embodiments of the present disclosure, drawings required for use in the embodiments will be described briefly below. It is to be understood that the drawings below are merely illustrative of some embodiments of the present disclosure, and therefore should not be considered as limiting its scope. It will be understood by those of ordinary skill in the art that other relevant drawings can also be obtained from these drawings without any inventive effort.

DETAILED DESCRIPTION OF EMBODIMENTS

Figure 1:
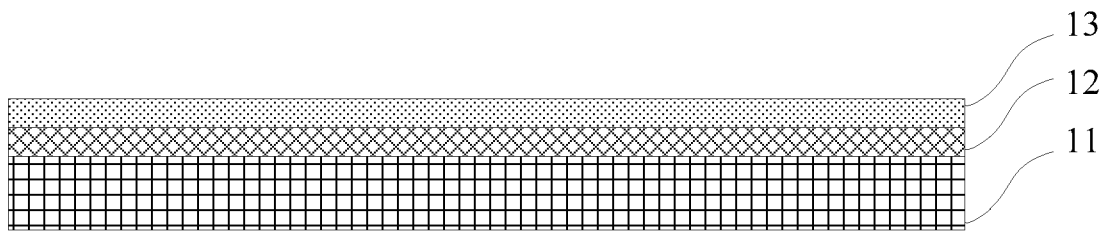
FIG. 1 is a schematic structural diagram of an epitaxial wafer according to an embodiment of the present disclosure.

In order to make the objects, technical solutions, and advantages of the embodiments of the present disclosure more clear, the technical solutions of the embodiments of the present disclosure will be described below clearly and completely with reference to the drawings of the embodiments of the present disclosure. It is apparent that the embodiments to be described are some, but not all of the embodiments of the present disclosure. Generally, the components of the embodiments of the present disclosure, as described and illustrated in the figures herein, may be arranged and designed in a wide variety of different configurations.

Thus, the following detailed description of the embodiments of the present disclosure, as represented in the figures, is not intended to limit the scope of the present disclosure as claimed, but is merely representative of selected embodiments of the present disclosure. All the other embodiments obtained by those of ordinary skill in the art in light of the embodiments of the present disclosure without inventive efforts shall fall within the scope of the present disclosure as claimed.

It should be noted that similar reference numerals and letters refer to similar items in the following figures, and thus once an item is defined in one figure, it may not be further defined or explained in the following figures.

Referring to FIG. 1, FIG. 1 is a schematic diagram of an epitaxial wafer according to the present embodiment, the epitaxial wafer at least comprises a Si substrate layer 11, an insulating layer 12, and a nitride semiconductor layer 13.

The insulating layer 12 is formed on a surface of the Si substrate layer 11, and the nitride semiconductor layer 13 is formed on a surface of the insulating layer 12 facing away from the Si substrate layer 11. In the present embodiment, the insulating layer 12 is thin enough to allow efficient quantum tunneling of free electrons and holes, but is thick enough so that the generation of free electrons-holes can be suppressed. Correspondingly, the holes may be considered as being able to pass through the insulating layer 12 via tunneling.

Optionally, in the present embodiment, the insulating layer 12 may be a $SiN_x$ thin film layer formed on the surface of the above-mentioned Si substrate layer 11. The $SiN_x$ layer is formed by nitridation of the Si substrate surface. The $SiN_x$ thin film layer may be formed on the Si substrate layer 11 by nitridation of the Si substrate surface by means of, for example, molecular beam epitaxy growth, and the $SiN_x$ thin film layer may allow growth thereon of the nitride semiconductor layer 13 such as an InGaN layer.

Optionally, in the present embodiment, the insulating layer 12 may have a thickness of 1 to 4 nanometers, for example the thickness may be 2 to 3 nanometers, so as to ensure that electrons and holes can pass through the insulating layer 12 via quantum tunneling.

Optionally, in the present embodiment, the nitride semiconductor layer 13 may be an InGaN layer. An In content of the InGaN layer is between 30% and 80%, which can ensure that an energy band alignment of the valence band of Si with the conduction band of InGaN occurs within the composition range.

Optionally, in the present embodiment, a ratio of content of InN to GaN in the InGaN layer is 46:54.

Since the InGaN layer grown on the Si substrate layer 11 has inherent crystallographic defects, the crystallographic defects act as donors such that the InGaN layer becomes naturally n-type conductive without being intentionally doped. Therefore, in the present embodiment, the InGaN layer may be used as an N-type semiconductor layer, and the Si substrate layer 11 may be used as a P-type semiconductor layer. Here, the Si substrate layer 11 may be a P-type Si (111) wafer.

Optionally, in the present embodiment, the InGaN layer has a thickness between 50 nanometers and 2 microns to ensure manufacture compatibility of a planar component manufactured using the epitaxial wafer according to the present embodiment.

Optionally, in the present embodiment, the InGaN layer is a homogeneous layer with a uniform In content, or the InGaN layer may also be a heterostructure layer with varying In content of any design and form, e.g., a planar layer, a corrugated layer, a nanowire network, or nanocolumns. As to the so-called heterostructure of semiconductor, semiconductor thin films of different compositions and/or different materials are deposited in sequence on the single Si substrate layer 11. Since the heterostructure of semiconductor can restrict electrons and holes within an intermediate layer, the electronic properties of the InGaN layer can be tailored (customized) by providing different heterostructures. In other words, in the present embodiment, the electronic properties of the InGaN layer can be tailored so as to adjust the current rectifying behavior of the diode made from the epitaxial wafer.

The present embodiment further provides a diode manufactured using the epitaxial wafer described above.

In order to facilitate an examiner's understanding of the solution provided in the present disclosure, the principle of operation of the diode according to the present disclosure will be described below by way of example.

An epitaxial wafer from which the diode is made is taken as an example, in which the Si substrate layer 11 is a P-type semiconductor and the InGaN layer is an N-type semiconductor. In a case where the valence band of the Si substrate layer 11 is aligned with the conduction band of the InGaN layer, the current does not face any energy barrier, and a current is allowed to flow under both a forward bias voltage and a reverse bias voltage. In a case where the energy bands are misalignment, the flow of the current will be affected by an energy barrier.

In a case where there is no insulating layer 12 between the Si substrate layer 11 and the InGaN layer, when a forward bias voltage is applied (i.e., a negative potential is applied to the InGaN layer), free electrons are driven from the Si—InGaN junction to recombine with holes, and holes are driven from the Si substrate layer towards the Si—InGaN junction to recombine with electrons so as to generate a forward current. In a case where the energy bands are aligned, electrons recombine with holes so as to generate a forward current. In other words, the forward current is generated by a recombination of electrons and holes.

When a reverse bias voltage is applied (i.e., a positive potential is applied to the InGaN layer), electrons and holes are driven away from the Si—InGaN junction to generate free electrons and holes at the Si—InGaN junction so as to generate a reverse current. The reverse current in the Si—InGaN junction with energy bands perfectly aligned shows an ohmic behavior, that is, there is a linear relationship between the reverse current and the applied voltage.

In the present embodiment, an insulating layer 12 is added between the Si substrate layer 11 and the InGaN layer. Free electrons pass through the insulating layer 12 via quantum tunneling and the insulating layer 12 does not change the alignment of energy bands of the Si substrate layer 11 and the InGaN layer, which is determined by their respective electron affinities. Free electrons and holes are located on different sides of the insulating layer 12, free electrons from the InGaN layer can still tunnel through the insulating layer 12 and recombine with holes in the Si substrate layer 11, and correspondingly, holes from the Si substrate layer 11 can also be considered as being capable of tunneling through the insulating layer 12 and recombining with free electrons in the InGaN layer. Such movements of free electrons and holes generate a forward current. Although the addition of the insulating layer 12 results in an addition of a tunnel resistance, with the tunnel resistance leading to an exponential increase of the forward current with negative inverse of the applied bias voltage (Fowler-Nordheim tunneling). The corresponding turn-on voltage can be kept very low when the thickness of the insulating layer 12 is kept very small (of the order of several nanometers).

The situation is different for the reverse current, the reverse current is formed based on free electrons and holes generated at the Si—InGaN junction by electrons and holes driven away from the Si—InGaN junction (i.e., formation of free electrons and generation of holes by electrons freed from atoms). Unlike recombination of free electrons and holes, the generation of free electrons and the generation of holes must occur simultaneously at the Si—InGaN junction and free electrons and holes must equally contribute to the respective current due to charge conservation. Therefore, the insulating layer 12 added at the Si—InGaN junction strongly hinders the generation of free electrons and holes, that is, the reverse current is blocked.

In the present embodiment, there is a compromise for the thickness of the insulating layer 12, being thin enough to allow efficient quantum tunneling of free electrons but thick enough to guarantee hindering the generation of free electrons and holes at the Si—InGaN junction. In this way, at the Si—InGaN junction, a forward current is allowed and a reverse current is blocked, so that the Si—InGaN junction has rectifying current-voltage characteristics.

Inventors carried out a relevant experiment in order to prove the high performance of the diode which is made from the epitaxial wafer according to the present embodiment.

Figure 2:
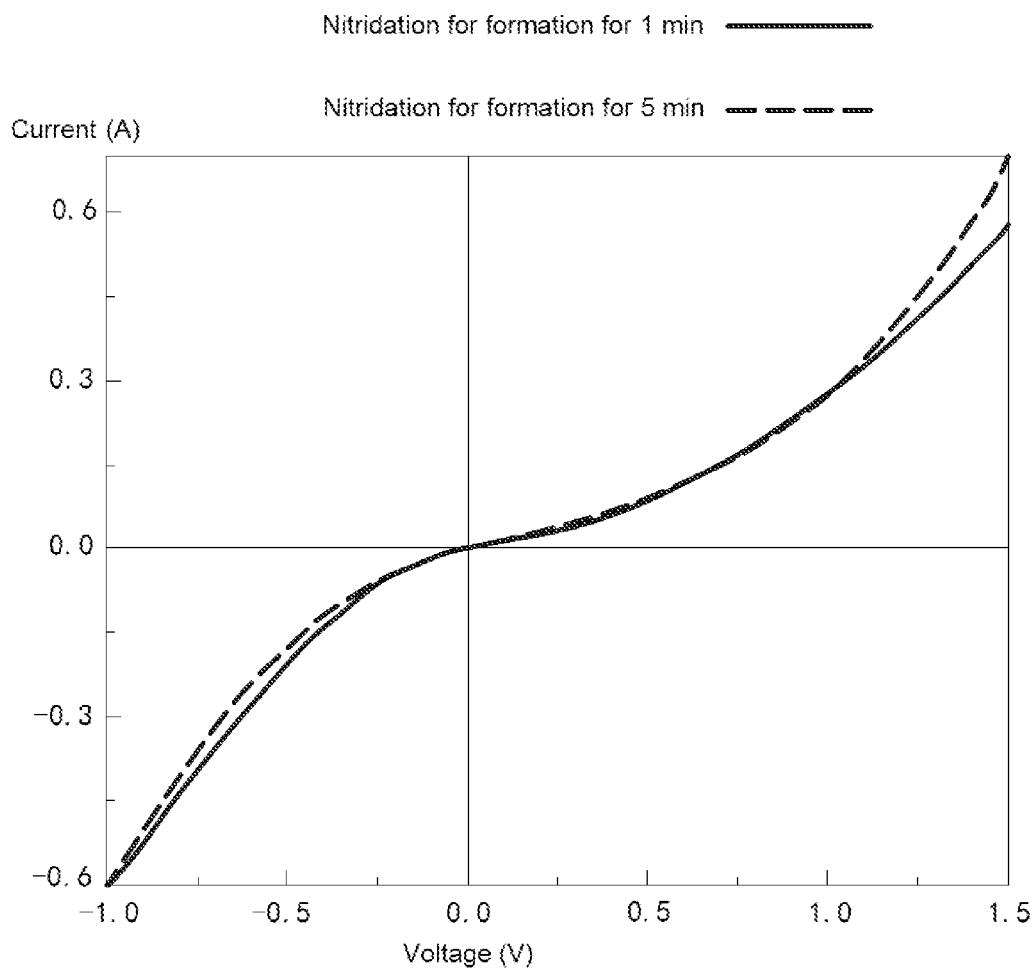
FIG. 2 is a schematic diagram showing current-voltage curves of a diode upon nitridation for formation of an insulating layer for 1 minute and 5 minutes.
Figure 3:
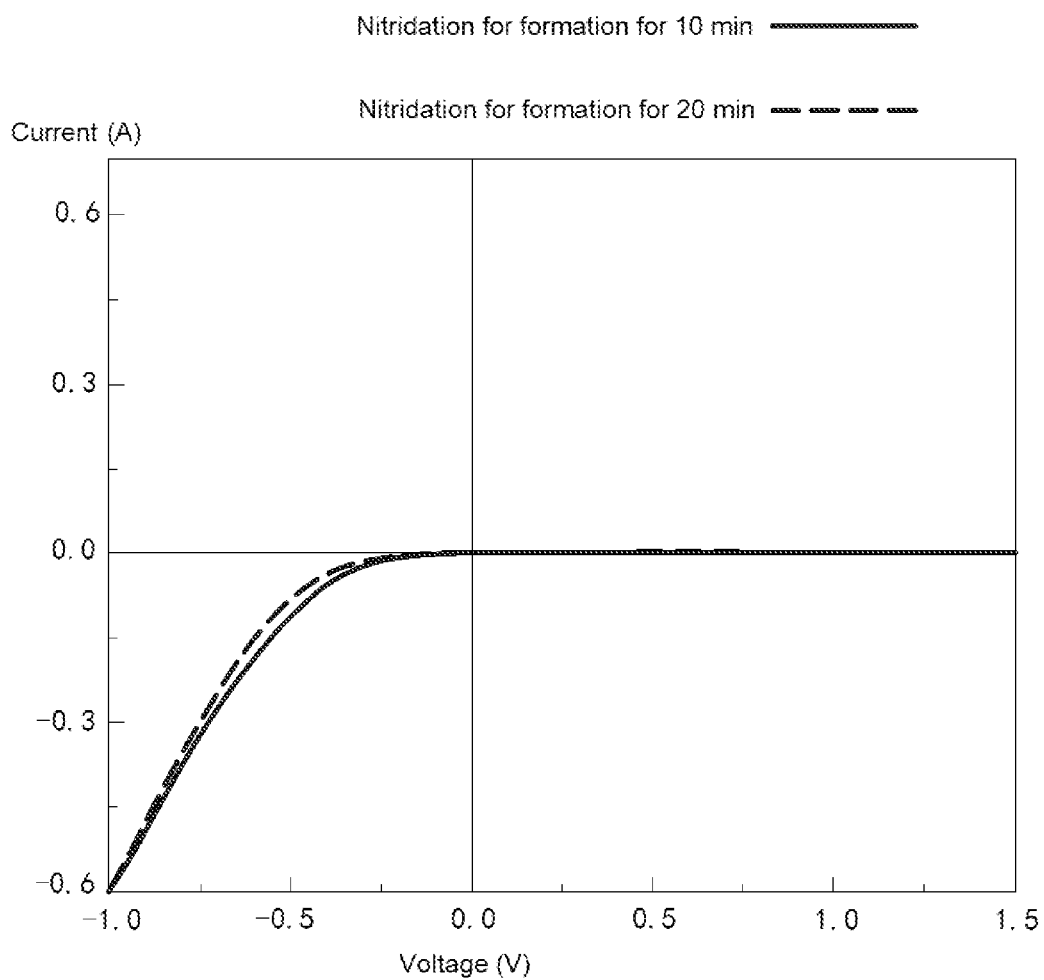
FIG. 3 is a schematic diagram showing current-voltage curves of a diode upon nitridation for formation of an insulating layer for 10 minutes and 20 minutes.

Referring to FIG. 2 and FIG. 3, current-voltage curves of the diode according to the present embodiment under different nitridation durations of the insulating layer 12 are shown. Here, the abscissa represents a voltage value applied to the InGaN layer, which is negative when a forward bias voltage is applied and which is positive when a reverse bias voltage is applied.

FIG. 2 shows current-voltage curves of the diode upon nitridation for formation of the insulating layer 12 for 1 minute and 5 minutes, respectively. It can be seen that when the nitridation duration is 1 minute and 5 minutes, the current-voltage curve of the diode shows a near-ohmic behavior, wherein the current-voltage curve passes through the zero and has a large slope at larger voltages. This is caused by too short nitridation time which leads to a too small thickness of the formed insulating layer 12. When the nitridation duration is 1 minute, the current-voltage behavior is not perfectly ohmic, this is because perfect alignment of energy bands cannot be achieved due to limited experimental conditions.

FIG. 3 shows current-voltage curves upon nitridation for formation of the insulating layer 12 for 10 minutes and 20 minutes. It can be seen that there is a distinct turn-on voltage for the forward current at a forward bias voltage of −0.5 V, and the turn-on voltage is slightly larger for a nitridation duration of 20 minutes than for a nitridation duration of 10 minutes. It can be seen from FIG. 3 that the insulating layers 12 formed by undergoing nitridation for formation for 10 minutes and 20 minutes have a thickness allowing a tunneling current under a forward bias voltage and are thick enough to be capable of blocking a reverse current under a reverse bias voltage.

It can be seen from FIG. 2 and FIG. 3 that the current-voltage characteristic of the diode is turned from ohmic to highly rectifying behavior, with increasing nitridation duration for formation of the insulating layer 12 (i.e., increasing thickness of the insulating layer 12).

The present embodiment further provides a current rectifier, comprising a diode 10 made from the epitaxial wafer described above. The current rectifier may be, but is not limited to, a half-wave current rectifying circuit, a full-wave current rectifying circuit, a bridge rectifier, or the like.

Figure 4:
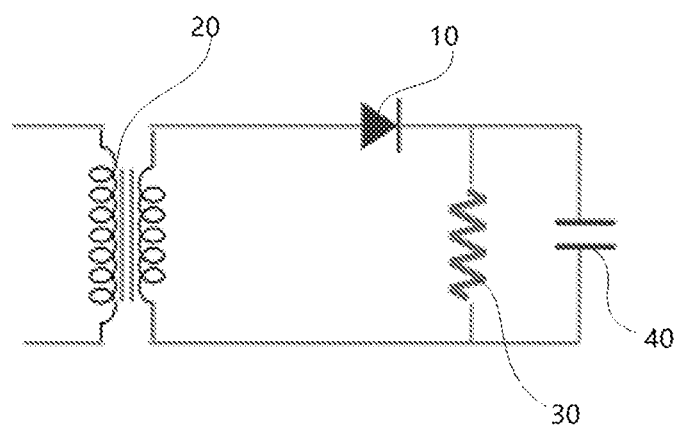
FIG. 4 is a schematic circuit diagram of a current rectifier according to an embodiment of the present disclosure.

Referring to FIG. 4, taking a half-wave current rectifying circuit as an example, the current rectifier may further comprise a transformer 20, a capacitor 40, and a resistor 30. An alternating current (usually a sinusoidal alternating current) is inputted to the transformer 20, and the transformer 20 can adjust the voltage. The adjusted voltage is transmitted to the diode 10. The current flows into the load resistor 30 only when a voltage of positive polarity is supplied (that is, when the diode 10 is under forward bias voltage). The capacitor 40 is charged by the positive half-waves of the pulsating current. During the intervals corresponding to the duration of the negative half-waves, electric energy is discharged into the load resistor 30. In this way, the pulsating current is smoothly or averagely rectified to be unidirectional. At the load resistor 30, a unidirectional output voltage is supplied.

Figure 5:
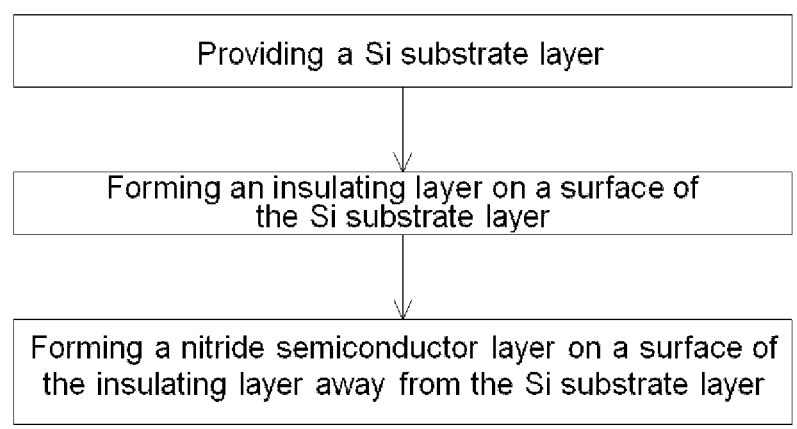
FIG. 5 is a schematic flowchart of a method of manufacturing an epitaxial wafer according to an embodiment of the present disclosure.

Referring to FIG. 5, the present embodiment further provides a method of manufacturing the epitaxial wafer described above. The method may comprise the following steps:

step S510 of providing a Si substrate layer;

step S520 of forming an insulating layer on a surface of the Si substrate layer; and step S530 of forming a nitride semiconductor layer on a surface of the insulating layer facing away from the Si substrate layer.

Here, the insulating layer is configured to have a thickness allowing free electrons and holes to pass through the insulating layer via quantum tunneling.

Optionally, in the step S510, a P-type Si (111) wafer may be provided as the Si substrate layer.

Optionally, in the step S520 before the insulating layer is formed, the Si substrate layer might need to be subjected to pre-treatment, such as ultrasonic cleaning or heating at high temperature, whose specific steps are well-known to those skilled in the art and will not be described in detail herein.

Optionally, in the step S520, a $SiN_x$ thin film layer may be formed on the Si substrate layer as the insulating layer by a surface nitridation method. The insulating layer may have a thickness of 1 to 4 nanometers, for example, the thickness may be 2 to 3 nanometers.

It should be noted that in other implementations of the present embodiment, the insulating layer may be formed by any other deposition methods such as chemical vapor deposition, sputtering, evaporation, or the like, thus the insulating layer may be formed from any insulating material such as $SiO_x$, $SiN_x$, $SiNO_x$, or other metal nitrides and oxides.

Optionally, in the step S530, the nitride semiconductor layer is an InGaN layer made by mixing GaN with InN; the formation of the InGaN layer includes molecular beam epitaxy. For example, the InGaN layer may be grown at a temperature of 300 to 600° C. The InGaN layer may be grown to a thickness of 50 nm to 2 microns at a rate of 0.1 to 1 micron per hour. The In content in the InGaN layer is between 30% and 80%.

In general, epitaxial growth means growing, on the Si substrate layer, a monocrystalline layer meeting certain requirements and having a well-defined crystallographic relationship with the Si substrate layer, as expanding the original wafer outwards to a certain extent. Epitaxial growth is a technique for manufacturing monocrystalline thin films, which is a method of growing thin films layer by layer on the appropriate Si substrate layer along a direction of crystallographic axis of the material of the Si substrate layer. This technique has following advantages: a low temperature of the Si substrate layer in use, easy and precise control over light beam flux intensity, and capability of quickly adjusting components, composition and doping concentration of films and layers with variation of light sources. With such technique, a monocrystalline thin film with a thickness of several microns can be manufactured, and ultrathin layered materials with a quantum microstructure can be formed by alternately growing thin films having different components and doped with different methods. The above epitaxial growth method may be molecular beam epitaxy, metalorganic vapor phase epitaxy, or chemical vapor deposition method. The molecular beam epitaxy is an epitaxial film-making method, and is also a special vacuum coating process. The metalorganic vapor phase epitaxy and the chemical vapor deposition rely on gas source transmission and pyrolysis reaction, with synthesis and decomposition taking place simultaneously. When hydrogen carries metalorganic compound vapor and non-metallic hydrides to be over the Si substrate layer heated inside a growth chamber, a series of chemical reactions take place and an epitaxial layer is generated on the Si substrate layer.

If it is necessary to manufacture a semiconductor component from the epitaxial wafer according to the present embodiment, metal contact points may be deposited on the InGaN layer, which is formed in a manner such as photolithography, metal deposition, or peeling. The metal may be Al, Au, Ni, or the like. Back contact points may be evaporated using the same metals. Annealing is performed for 5 to 10 min at 200 to 400° C. for forming an ohmic contact. The above layer structure is etched into dimensions of, e.g., 0.01×0.01 $cm^2$ to 0.1×0.1 $cm^2$. Metal wires may be bonded to the metal contact points and back contact points on the InGaN layer.

The above description is merely illustrative of various embodiments of the present disclosure, but the scope of protection of the present disclosure is not limited thereto, any variations or alternatives that can be readily envisaged by those skilled in the art within the technical scope disclosed in the present disclosure are intended to be encompassed in the scope of protection of the present disclosure. Therefore, the scope of protection of the present disclosure should be determined by the scope of protection of the claims.

INDUSTRIAL APPLICABILITY

In the epitaxial wafer, the method of manufacturing the epitaxial wafer, the diode, and the current rectifier according to the present disclosure, an insulating layer is added between a Si substrate layer and a nitride semiconductor layer. Under a forward bias voltage, the insulating layer may allow electrons and holes to pass from one side to the other side of the insulating layer via quantum tunneling and recombine with holes and electrons, respectively; and under reverse bias, the insulating layer can hinder formation of free electrons and holes so as to block a reverse current. Thus, the epitaxial wafer is enabled to have the characteristic of allowing passage of a current only in one direction and can be made into a diode or the like for a current rectifying component.

What is claims is:

1. An epitaxial wafer comprising:
a Si substrate layer;
an insulating layer formed on the Si substrate layer; and
a nitride semiconductor layer formed on a surface of the insulating layer facing away from the Si substrate layer,
wherein the insulating layer is configured to have a thickness allowing free electrons to pass through the insulating layer via quantum tunneling,
wherein the nitride semiconductor layer is an InGaN layer made by mixing GaN with InN,
wherein an In content in the InGaN layer is between 30% and 80%,
wherein a conduction band of the InGaN layer is aligned with a valence band of the Si substrate layer.

2. The epitaxial wafer according to claim 1, wherein the insulating layer is a SiNx thin film layer.

3. The epitaxial wafer according to claim 1, wherein the insulating layer has a thickness of 1 to 4 nanometers.

4. The epitaxial wafer according to claim 3, wherein the insulating layer has a thickness of 2 to 3 nanometers.

5. The epitaxial wafer according to claim 1, wherein the InGaN layer has a thickness between 50 nanometers and 2 microns.

6. The epitaxial wafer according to claim 1, wherein the InGaN layer is a homogeneous layer with uniform In content, or a heterostructure layer with varying In content.

7. The epitaxial wafer according to claim 1, wherein a ratio of content of InN to GaN in the InGaN layer is 46:54.

8. The epitaxial wafer according to claim 1, wherein the Si substrate layer is a P-type Si (111) wafer.

9. A method of manufacturing an epitaxial wafer according to claim 1, the method comprising following steps of:
providing a Si substrate layer;
forming an insulating layer on a surface of the Si substrate layer; and
forming a nitride semiconductor layer on a surface of the insulating layer facing away from the Si substrate layer,
wherein the insulating layer is configured to have a thickness allowing free electrons to pass through the insulating layer via quantum tunneling.

10. The method of manufacturing an epitaxial wafer according to claim 9, wherein the insulating layer is a SiNx thin film layer; and the SiNx thin film layer is formed by ways including molecular beam epitaxy.

11. The method of manufacturing an epitaxial wafer according to claim 9, wherein the insulating layer has a thickness of 1 to 4 nanometers.

12. The method of manufacturing an epitaxial wafer according to claim 11, wherein the insulating layer has a thickness of 2 to 3 nanometers.

13. The method of manufacturing an epitaxial wafer according to claim 9, wherein the nitride semiconductor layer is an InGaN layer made by a mixing GaN with InN; and the InGaN layer is formed by ways including molecular beam epitaxy.

14. The method of manufacturing an epitaxial wafer according to claim 13, wherein an In content in the InGaN layer is between 30% and 80%.

15. The method of manufacturing an epitaxial wafer according to claim 8, wherein the step of providing the Si substrate layer comprises:
providing a P-type Si (111) wafer as the Si substrate layer.

16. A diode made from the epitaxial wafer according to claim 1.

17. The epitaxial wafer according to claim 2, wherein the insulating layer has a thickness of 1 to 4 nanometers.

* * * * *